United States Patent [19]

Cizin

[11] Patent Number: 5,112,238
[45] Date of Patent: May 12, 1992

[54] ELECTRICAL CONNECTOR

[75] Inventor: Miguel Cizin, Bedminster Township, Somerset County, N.J.

[73] Assignee: AT&T Bell Laboratories, Murray Hill, N.J.

[21] Appl. No.: 729,526

[22] Filed: Jul. 12, 1991

[51] Int. Cl.[5] ...................... H01R 13/70; H01R 31/08
[52] U.S. Cl. ................................... 439/188; 200/51.1; 439/510
[58] Field of Search .................. 439/188, 507–514; 200/51.1

[56] References Cited

U.S. PATENT DOCUMENTS

| | | | |
|---|---|---|---|
| 3,500,295 | 3/1970 | Faber | 439/686 |
| 4,070,557 | 1/1978 | Ostapovitch | 200/51.1 |
| 4,179,173 | 12/1979 | Rise, III | 200/51.1 |
| 4,786,258 | 11/1988 | Shaffer et al. | 200/51.1 |
| 4,874,333 | 10/1989 | Reed | 439/514 |
| 5,044,994 | 9/1991 | Van Woensel | 439/681 |

OTHER PUBLICATIONS

S. M. Ambekar, W. E. Hamilton and T. E. Cole, "Systems Packaging", *AT&T Technical Journal*, vol. 66, (Jul./Aug. 1987), pp. 81–95.

*Primary Examiner*—Neil Abrams
*Attorney, Agent, or Firm*—L. H. Birnbaum

[57] ABSTRACT

Disclosed is a backplane connector with shorting contacts for providing re-routing of signals when a circuit pack is withdrawn from its shelf. Shorting contacts are mounted on a block which is attached to the inside of an insulating shroud surrounding the contact pins. The shorting contacts make electrical contact between pins when a circuit pack is removed, but are otherwise electrically isolated from the pins.

10 Claims, 2 Drawing Sheets

ELECTRICAL CONNECTOR

BACKGROUND OF THE INVENTION

This invention relates to electrical connectors.

Standard electrical interconnection systems, such as the FASTECH ® system, usually include a plurality of circuit packs with connectors on one edge and a backplane with compliant pins protruding therefrom. The circuit packs are inserted into a shelf so that the connector makes electrical contact with the backplane pins. Interconnection of the circuit packs is achieved by wires or deposited conductors which provide electrical connection between the backplane pins. (See, e.g., Ambekar et al, "Systems Packaging" *AT&T Technical Journal*, Vol. 66 (July/August 1987), pp. 81-95.)

One desirable feature of such systems, especially in telecommunications applications, is to be able to remove a circuit pack and re-route the signal from the backplane to another circuit pack so a customer does not lose service. This can be achieved by providing shorting contacts between pins so that the contacts provide electrical connection between the pins when the circuit pack is removed but are electrically isolated from the pins when the circuit pack is fully inserted in the shelf. These contacts can be mounted in the backplane (see, e.g., U.S. Pat. No. 4,179,173 issued to Rise, III) or in an insulating housing surrounding the backplane pins (see, e.g., U.S. Pat. No. 4,070,557 issued to Ostapovitch, and U.S. Pat. No. 4,874,333 issued to Reed).

Since pin density is continually increasing, it is desirable to provide shorting contacts which can be used easily in such high density applications.

SUMMARY OF THE INVENTION

This and other objects are achieved in accordance with the invention, which is an electrical connector comprising an insulating shroud including at least one wall and a plurality of pins mounted within the shroud so that the pins extend in a direction essentially parallel to the wall. A contact member is mounted to the wall, the member comprising an insulating block. A spring contact comprising a tab and at least a pair of tynes at an acute angle thereto has its tabs mounted in the block so that the pair of tynes make electrical contact with two of the pins.

BRIEF DESCRIPTION OF THE DRAWING

These and other features of the invention are delineated in detail in the following description. In the drawing.

It will be appreciated that, for purposes of illustration, these figures are not necessarily drawn to scale.

DETAILED DESCRIPTION

Figure 1:
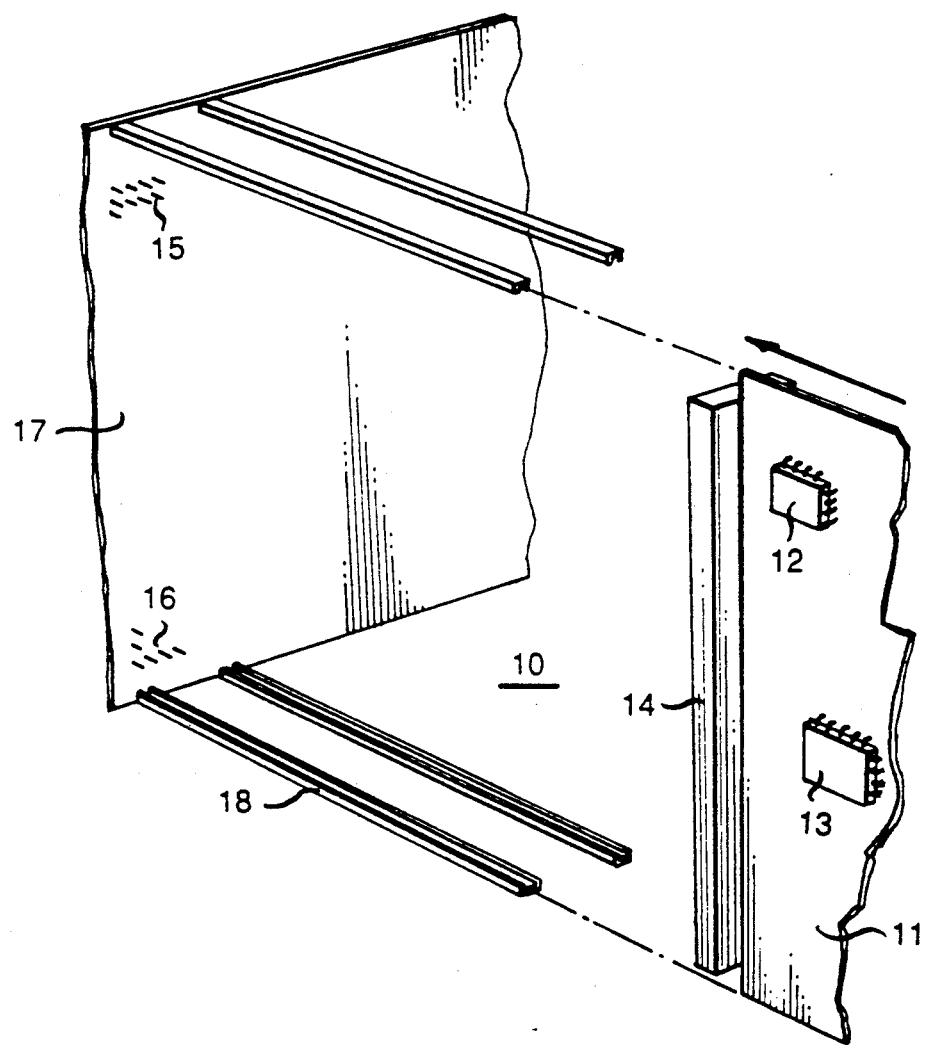
FIG. 1 is a perspective view of a portion of a typical electrical interconnection system.

FIG. 1 illustrates a portion of a typical interconnection system which can utilize the invention. A circuit pack includes a printed circuit board, 11, on which is mounted a plurality of semiconductor devices, two of which are shown as 12 and 13. Electrical conductors and other components, such as resistors and capacitors, are not shown for purposes of clarity in the illustration. A socket-type connector, 14, is mounted to the edge of the circuit board. The socket-type connector comprises a housing with a plurality of apertures, each including a contact which has one end bonded to conductive pads on the circuit board. The other end includes a conductive tyne for engaging a compliant pin (see, e.g., U.S. patent application of Englert et al, Ser. No. 661,363, filed Feb. 26, 1991 and assigned to the present assignee). An array of compliant pins, only some of which, e.g., 15 and 16 are shown, are mounted within a backplane 17. When the circuit pack is slid forward on a rail, 18, the compliant pins will electrically engage associated contacts in the socket-type connector, 14, to thereby electrically contact the components on the circuit pack. It will be appreciated that there are usually many circuit packs mounted on a shelf and coupled to the backplane. These circuit packs are interconnected by conductors or wires coupled to the compliant pins on the backplane.

Figure 2:
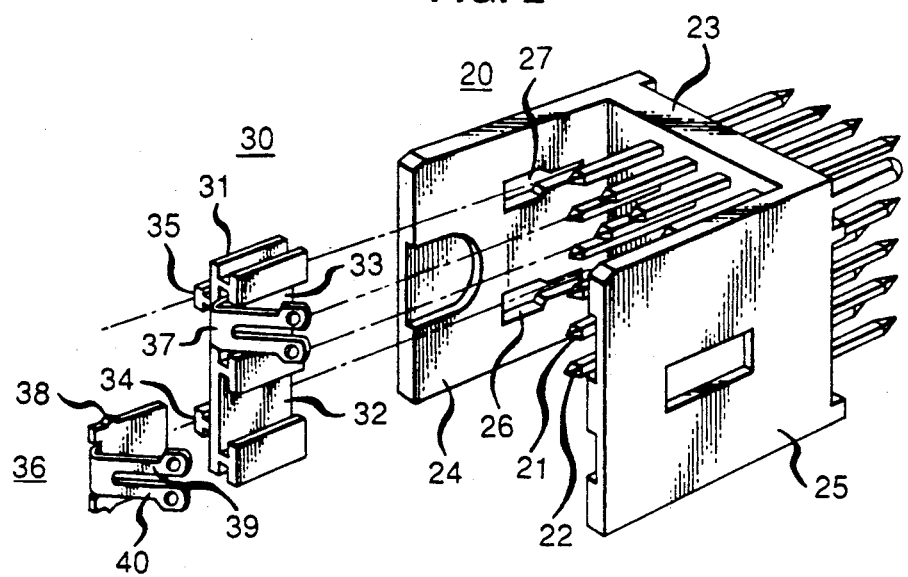
FIG. 2 is an exploded, perspective view of a connector in accordance with an embodiment of the invention.

In order to provide re-routing of any signals to a circuit pack which has been removed from the shelf, the backplane connector, 20, of FIG. 2 is included. The connector, 20, includes an array of compliant pins, e.g., 21 and 22, which are mounted within a bottom wall, 23, of an insulating housing, hereinafter referred to as a shroud. The shroud also includes a pair of side walls 24 and 25 which extend from the bottom wall in a direction essentially parallel to and beyond the ends of the pins. One of the walls, 24, includes a pair of slots, 26 and 27, for mounting a contact member, 30, therein.

The contact member, 30, comprises an insulating block 31, such as a thermoplastic polyester (30 percent glass-filled), with a pair of slots, 32 and 33, running the width of one major surface of the block. The opposite major surface of the block includes a pair of projections, 34 and 35, which mate with the slots 26 and 27 in the wall 24 of the shroud to provide a bayonet-closure-type of fastening of the member to the shroud.

A pair of spring contacts, 36 and 37, are mounted to the contact member 30. Each spring contact includes a tab portion, e.g., 38, for inserting into a slot, e.g., 32, of the contact member. The spring contact also includes a contact portion, comprising a pair of tynes 39 and 40 formed in a plane which makes an acute angle with the tab portion. The spring contact is typically formed from a single piece of metal (e.g., phosphor bronze) with the contact portion folded over to make an angle in the range 30–60 degrees with the tab portion.

When the contact member, 30, is mounted to the shroud, each tyne, 39 and 40, will make electrical contact with an associated pin, e.g., 21 and 22, so that the two associated pins will be electrically shorted to each other.

Thus, a plurality of connectors of the type illustrated in FIG. 2 can be mounted in a backplane (e.g., 17 of FIG. 1 minus the pins shown) by inserting therein the ends of the pins directed away from the shroud. A column of such backplane connectors would form the pin array for the socket-type connector 14 of the circuit pack, and one or more of the backplane connectors can include the shorting contact feature.

Figure 3:
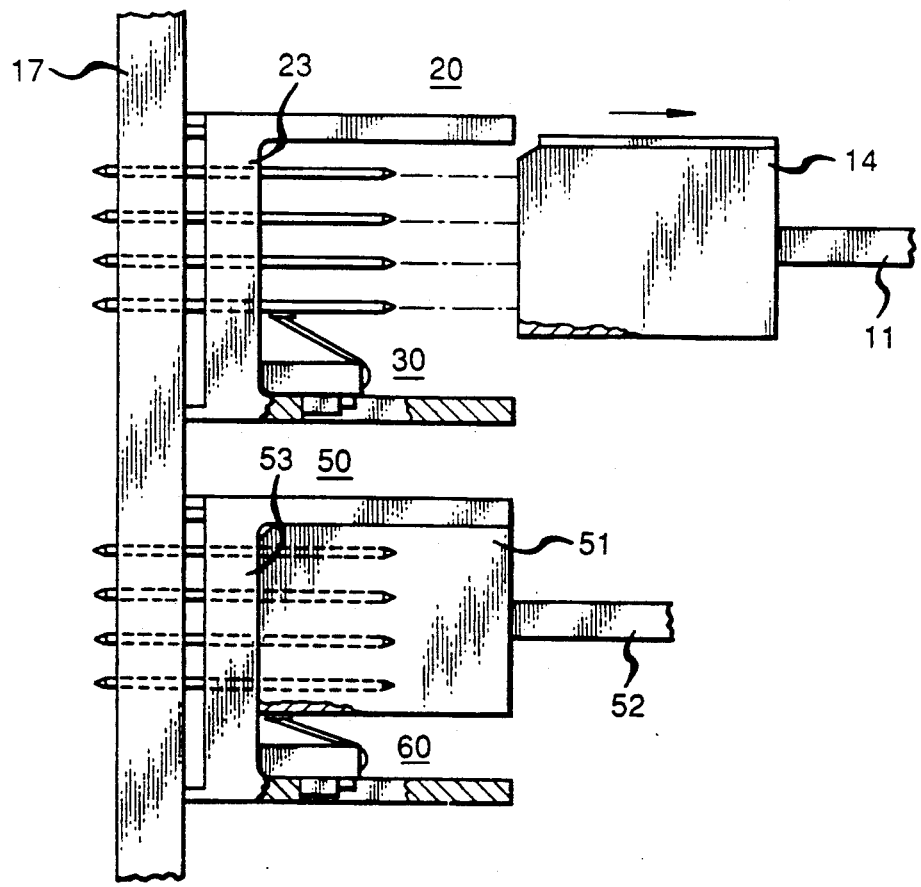
FIG. 3 is a top view of a portion of an interconnection system including a connector in accordance with an embodiment of the invention.

FIG. 3 is a schematic top view of a portion of a backplane, 17, showing the two top connectors 20 and 50 in adjacent columns of such backplane connectors. It will be noted that the circuit pack plugged into connector 50 pushes the spring contacts off their associated pins so that the contacts rest on the insulating housing of the socket connector (51) on the circuit pack. The spring contacts, therefore, are electrically isolated from the pins while the circuit pack is inserted. In the adjacent column, the circuit pack connector 14 has been removed from the backplane connector 20. This causes the spring contacts to make electrical contact with their associated pins in order to short circuit any signal intended for the removed circuit pack. Any such signals can be re-routed, for example, to the circuit pack inserted into connector 50. It will be further noted that the contact members, 30 and 60, are mounted as close as possible to the bottom surface, 23 and 53, of the shroud and preferably in direct contact therewith. This positioning ensures that, as the circuit pack is removed, the spring contacts will electrically contact the pins before contact is lost between the pins and the socket connector of the circuit pack. Thus, the signal can be re-routed without any loss of service.

It will be appreciated that although two spring contacts are shown inserted in each contact member, any number of such contacts could be employed. Further, each spring contact could include more than two tynes if desired. Also, the pins contacted by the tynes of the spring contact need not be adjacent to each other.

It will also be appreciated that the tabs of the spring contacts could be molded into the block during an insertion molding operation, rather than inserting the contacts into slots as shown in FIG. 2.

Various additional modifications will become apparent to those skilled in the art. All such variations which basically rely on the teachings through which the invention has advanced the art are properly considered within the scope of the invention.

I claim:

1. An electrical connector comprising:
   an insulating shroud including at least one wall;
   a plurality of pins mounted within the shroud so that the pins extend in a direction essentially parallel to the wall;
   a contact member mounted to the wall, said member comprising an insulating block; and
   a spring contact comprising a tab and at least a pair of tynes at an acute angle thereto, the tab being mounted in the block so that the pair of tynes make electrical contact with two of the pins.

2. The connector according to claim 1 wherein the spring contact is oriented so that insertion of a socket connector over the pins pushes the tynes out of contact with the pins.

3. The connector according to claim 1 wherein the ends of the pins are inserted into a backplane.

4. The connector according to claim 1 wherein the contact member comprises a plurality of slots and a spring contact tab is inserted in each slot.

5. The connector according to claim 1 wherein the insulating block comprises a thermoplastic polyester.

6. The connector according to claim 1 wherein the pins are inserted into a bottom surface of the shroud, and the contact member is mounted in close proximity to the bottom surface.

7. The connector according to claim 6 wherein the contact member is mounted in physical contact with the bottom surface.

8. The connector according to claim 1 wherein the tynes make an angle with the tab within the range 30-60 degrees.

9. The connector according to claim 1 wherein the wall includes a slot and the contact member includes a projection which fits within the slot in order to mount the member to the wall.

10. The connector according to claim 1 wherein the tynes make electrical contact to adjacent pins.

* * * * *